US006812560B2

(12) United States Patent
Recktenwald et al.

(10) Patent No.: US 6,812,560 B2
(45) Date of Patent: Nov. 2, 2004

(54) PRESS-FIT CHIP PACKAGE

(75) Inventors: Willi Recktenwald, Holzgerlingen (DE); Helmut Schettler, Dettenhausen (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/192,975

(22) Filed: Jul. 11, 2002

(65) Prior Publication Data

US 2003/0015776 A1 Jan. 23, 2003

(30) Foreign Application Priority Data

Jul. 21, 2001 (EP) .............................................. 01117599

(51) Int. Cl.[7] ............................................... H01L 23/48
(52) U.S. Cl. ........................................................ 257/697
(58) Field of Search ................................. 257/684, 688, 257/689, 691, 692, 693, 697, 698, 700, 785; 29/832, 837; 439/751, 931

(56) References Cited

U.S. PATENT DOCUMENTS

| | | | |
|---|---|---|---|
| 5,005,069 A | | 4/1991 | Wasmer et al. ................ 357/72 |
| 5,306,670 A | * | 4/1994 | Mowatt et al. ................ 29/832 |
| 5,758,513 A | | 6/1998 | Smith .......................... 62/457.5 |
| 5,865,645 A | | 2/1999 | Embo et al. ................. 439/567 |
| 6,160,309 A | | 12/2000 | Le .............................. 257/684 |
| 6,406,942 B2 | * | 6/2002 | Honda .......................... 438/119 |

* cited by examiner

Primary Examiner—David A. Zarneke
(74) Attorney, Agent, or Firm—Floyd A. Gonzalez

(57) ABSTRACT

A press-fit integrated chip package is provided comprising a laminate base structure having plated through holes for introducing press-fit elements, and a laminate cover structure providing very fine conducting paths and having a top mounting plane for mounting chips.

14 Claims, 2 Drawing Sheets

PRESS-FIT CHIP PACKAGE

BACKGROUND OF THE INVENTION

The present invention relates in general to semiconductor devices and in particular to a semiconductor chip package. Still more specifically, the present invention pertains to a semiconductor chip package that can be reliably connected with various contacts via press-fit technology.

Due to an ever increasing demand for performance and miniaturization, semiconductor manufacturers are continually driven to produce smaller semiconductor devices. In order to reduce the size of semiconductor device packages, manufacturers have developed single and multichip modules (SCMs and MCMs) that efficiently house semiconductor chips having a large number of connections.

Recent progress of miniaturization and density of semiconductor devices is leading to dense packages by using a semiconductor chip package structure in which a semiconductor chip is mounted on a wiring substrate by flip chip bonding to a wiring pattern on the wiring substrate, such as that presented by a ball grid array (BGA) type semiconductor device. Generally, a wiring substrate has one surface with a semiconductor chip mounted thereon by flip chip bonding to a wiring pattern formed on that surface, and has the other surface with external connector terminals formed thereon and electrically connected to the wiring pattern. Also, conventional pin-in-hole components may be attached to plated through-hole vias present on the substrate.

Thus, U.S. Pat. No. 5,758,413 discloses a chip package for carrying at least one flip chip die, comprising a multiple layer compound having a structure providing very fine conducting paths and having a connection layer for mounting chips in flip-chip technique, and at least one plated through hole or stacked via being provided for receiving conventional pin-in-hole components.

This package, however, is space-consuming and cannot be solder-free connected with various electrical contacts. In addition, when connecting this package with other contacts, connecting lines will have to be very long.

The need for high-volume assembly of components employing power semiconductor devices, along with the continued need for optimum heat-transfer capabilities for such devices, has therefore led to the development of "press-fit" packages. These packages, most often used for high power rectifier applications, have enjoyed increasing popularity, particularly in the automotive industry, where power rectifiers are often used in multiples of 6 or 8 in alternator designs and the like.

Examples of press-fit and comparable package designs can be found, e.g., in U.S. Pat. No. 5,005,069. In U.S. Pat. No. 6,160,309, there is disclosed a press-fit package, such as a press-fit rectifier, including an improved cup design which incorporates a mold lock formed within the inner wall of a cavity. Finally, U.S. Pat. No. 5,865,645 describes a press-fit plug connector for press-fitting into holes in a printed circuit board, including contacts which are each fastened at one end in a parallelepipedal plastic body and laterally guided in a molded part in slot-like recesses that are open toward the printed circuit board. The contacts have a free end with a press-fit section which is bent away at right angles toward the printed circuit board and two press-fit shoulders.

However, the chip packages described cannot be directly, solder-free, space-saving and reliably be connected with various electrical contacts via press-fitting techniques.

SUMMARY OF THE INVENTION

It is therefore an object of the present invention to provide a package structure which is reliably and compact.

It is a further object of the invention to provide such a package structure which can be quickly and easily connected to various different electrical contacts.

BRIEF DESCRIPTION OF THE DRAWINGS

These and other objects will be apparent to one skilled in the art from the following detailed description of the invention taken in conjunction with the accompanying drawings in which.

DESCRIPTION OF THE PREFERRED EMBODIMENT

Figure 1:
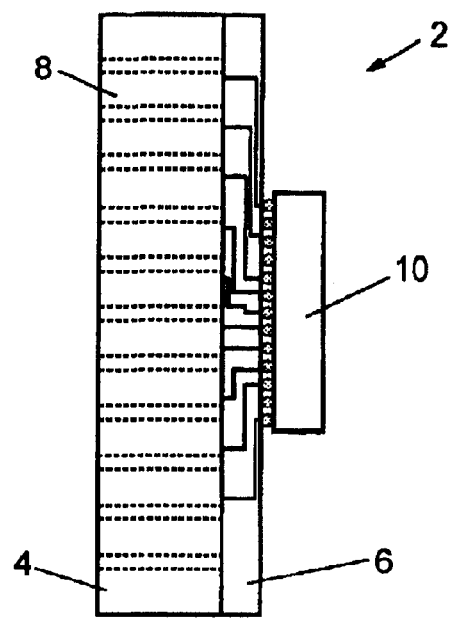
FIG. 1 is a schematic view of the press-fit chip package according to the invention.
Figure 4:
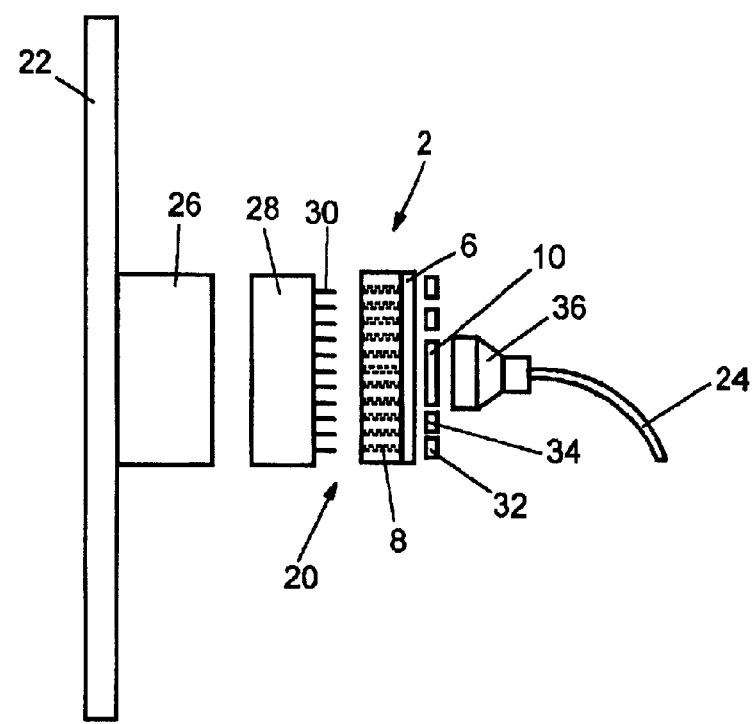
FIG. 4 shows a more detailed view of the cable connector of FIG. 3.

Referring now to FIG. 1, there is shown a schematic view of the press-fit chip package 2 according to the invention. The chip package is formed of two different laminate structures 4, 6, comprising conductor planes. The first laminate structure is a base structure 4, having an integrated compact connecting technique in the form of plated through holes (PTH) 8 for inserting of press-fit elements such as press-fit pins or receptacles (cf. FIG. 4). The second laminate structure is a cover structure 6 manufactured by means of organic multilayer thin film packages technologies comprising a connecting plane for mounting a chip 10 either by flip-chip (C4) or by bonding technique.

Figure 2:
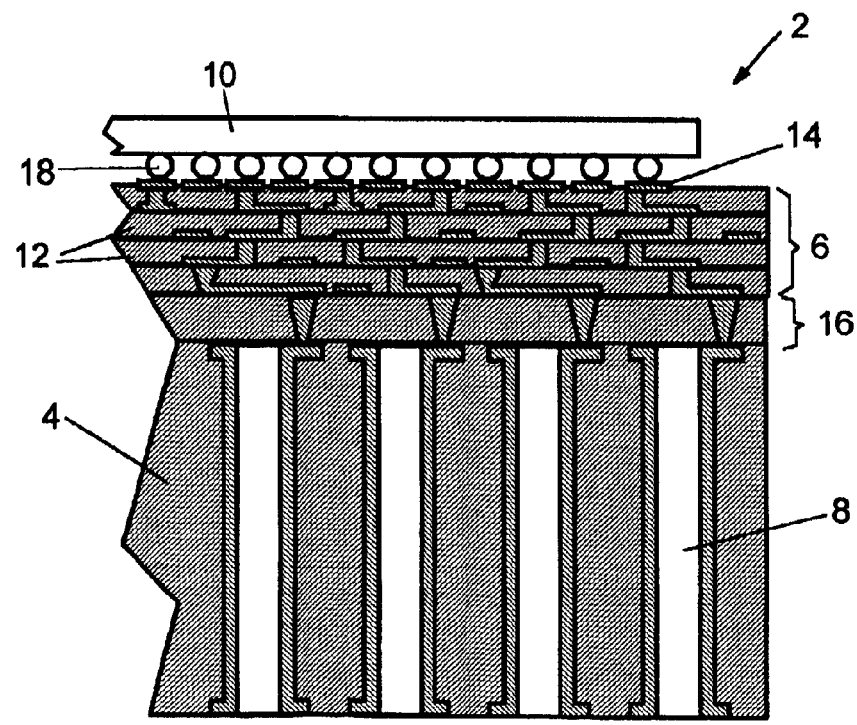
FIG. 2 is a more detailed view of the press-fit chip package of FIG. 1.

FIG. 2 is a more detailed view of the press-fit chip package 2 of FIG. 1. The base structure 4 may be formed of a PTH 8 standard package for press-fit interconnection components. It may be manufactured of resin bonded glass fabrics (e.g., FR4) and may have a thickness of about 3 to about 4 mm. This base structure is a very stiff component.

Above the base structure 4 there is arranged the second laminate structure, i.e., the cover structure 6. It is formed of thin film distribution layers 12 with a top mounting plane 14 opposite the base structure 4 for flip-chip attaching a chip 10. It has to be mentioned that wire bonding or any known attachment technique can be used as well. The cover structure 6 may also be manufactured of FR4 or the like or of polyimide thin film layers and may have a preferred thickness of about 0.025 to about 0.075 mm. It has to be mentioned that a thickness of less or more of this value may be used, depending on the respective application and on the fact how meaningful such a structure would be.

Both structures 4 and 6 may be combined in a hybrid structure where the cover structure forms a laminate compound with the base structure. Structure 6 will than be laminated layer by layer onto structure 4, i.e., structures 6 and 4 will be manufactured sequentially. It is also possible to manufacture the hybrid structure using structures 6 and 4 as sub composites. However, it is preferred to interpose a stiffen power and signal distribution layer 16 between the base layer 4 and the cover layer 6. This layer is conductively plated, i.e., may carry a metal plating, e.g., copper, and contains pre-drilled through holes and thus forms the transition of the base structure 4 to the thinfilm structure 6. The power and distribution layer 16 has not to be present in case the openings of the PTHs are closed using another technique, however, layer 16, covering the hole openings of the base structure 4, is especially advantageous if macro structures are combined with micro structures in multilayer compounds, since in this case, the surface topography should not be transferred into the thin film structure because of unevennesses and the danger of sagging of the complete structure. Simultaneously, layer 16 levels the base structure 4. It may be manufactured from FR4 or the like as well and may have a thickness of about 0.5 to about 1.0 mm. Again, it has to be mentioned that this thickness value is preferred and that values below or above this range could be used depending on feasibility and meaningfulness.

On top of the thin film distribution layer the chip 10 is arranged by means of solder balls (C4) 18 or any known solder/bonding technique.

It is also possible to realize a sandwich structure, where both structures 4, 6 are subsequently solidly coupled to each other both mechanically and electrically conductive. Doing this, structure 6 will be pre-manufactured and the chip may also be pre-mounted. Surface mount technology with solder ball/column or contact bonding can be used as the connecting technique, depending on the respective requirements and application.

Figure 3:
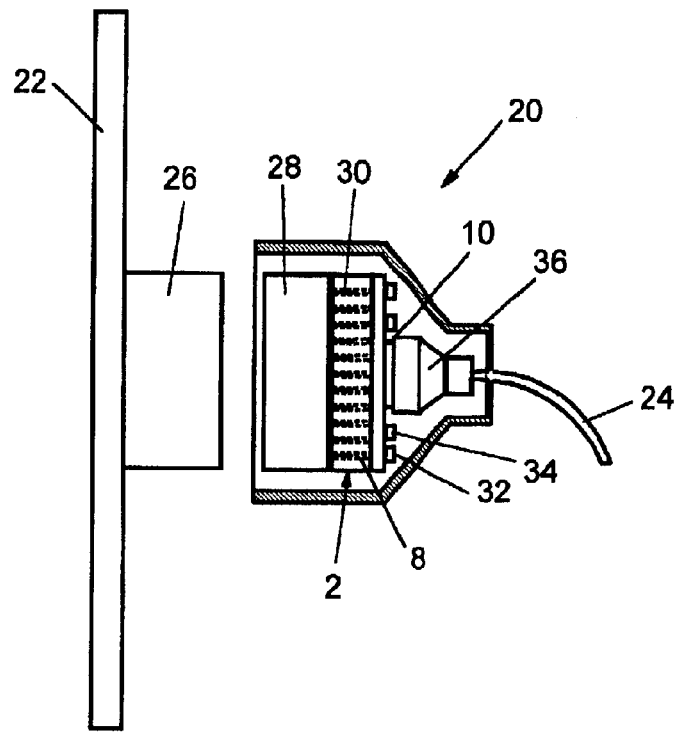
FIG. 3 shows a cable connector assembly with an integrated press-fit chip package according to the invention.

FIG. 3 shows an embodiment of the invention where the press-fit chip package 2 has been incorporated into a cable connector assembly 20 to connect a backplane 22 (printed circuit board) to, e.g., an optical vertical cavity surface emitting laser (VCSEL) device 10 via a fiber cable 24. The back plane 22 carries a back plane or plug header 26 where the cable connector assembly 20 can be connected to, the plug header 26 being the mating part to the cable connector. A more detailed view of this connection is given in FIG. 4. A press-fit receptacle connector 28, carrying press-fit elements such as press-fit tails 30 will be mounted to the press-fit chip package by known press-fit techniques. Subsequently, the connector 28 will be press-fitted into the press-fit chip package according to the invention, where the package carries the chip, which may be an optical transmitter and/or receiver chip (e.g., an array chip), and optionally additional surface mount components like, e.g., logic—, sender/receiver—and driver-chips, as well as passive components 32, 34. Then, an optical chip/cable adapter 36 can be fitted above the optical chip 10, carrying the fiber cable 24 to connect the optical device.

It has to be mentioned that the sequence of assembling the press-fit chip package according to the invention, i.e., chip 10, base and cover structure 4, 6 and connector 28 to form the complete chip package is optional and can be performed in both ways. This means that first the chip 10 may be assembled to the package and subsequently the package may be assembled to the connector 28, as well as the other way round, i.e., connecting the connector 28 to the package and subsequently attaching the chip 10.

The described chip package for press-fit interconnection is designed as a package having an integrated, compact electromechanical connecting technique for attaching press-fit pin-receptacles contacts. This integrated technique provides for solderless connection of various contacting and connecting components to the chip package using the press-fit technique.

The described solution is especially suitable for compact structures having very short communication paths and compact overall dimensions, tower-like three-dimensional as well as sandwich structures with lines being arranged orthogonal with respect to the components, solderless assembly of a chip carrier to a connecting element or direct connection to a printed circuit board by pressing both components, and realization of an electro-optical high-speed full duplex parallel cable interconnection of Z-servers via great distances.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A cable connector assembly comprising:
   a press-fit integrated chip package comprising a laminate base structure having plated through holes for introducing press-fit elements, and a laminate cover structure providing very fine conducting paths and having a top mounting plane;
   a chip mounted on said top mounting plane in electrical communication with said very fine conducting paths;
   an adapter fitted over said chip; and
   a cable attached to said adapter, said cable communicating with said chip.

2. A cable connector assembly according to claim 1 wherein said cover structure is a thin film distribution multi-layer structure.

3. A cable connector assembly according to claim 1 wherein an additional signal and power distribution layer is interposed between said base structure and said cover structure.

4. A cable connector assembly according claim 1 wherein said base structure is made of resin bonded glass fabrics and has a preferred thickness of about 3 to 4 mm.

5. A cable connector assembly according to claim 4, wherein said resin bonded glass fabrics is FR4 or the like.

6. A cable connector assembly according to claim 1 wherein said cover structure is made of resin bonded glass fabrics or polyimide or the like and has a preferred thickness of about 0.025 to 0.075 mm.

7. A cable connector assembly according to claim 3 wherein said signal and power distribution layer is made of resin bonded glass fabrics or the like and has a preferred thickness of about 0.5 to 1 mm.

8. A cable connector assembly according to claim 7, wherein said additional layer is conductively plated.

9. A cable connector assembly according to claim 7, wherein said additional layer carries a metal plating, preferably copper.

10. A cable connector assembly according to claim 1 wherein said chip is flip-chip attached to said top mounting plane.

11. A cable connector assembly according to claim 1 wherein said chip is bonded to said cover structure.

12. A cable connector assembly according to claim 1 wherein said cover structure additionally comprises surface mount components.

13. A cable connector assembly according to claim 12 wherein said surface mount components are selected from the group consisting of logic-chips, sender/receiver-chips and driver-chips, and passive components.

14. A cable connector assembly according to claim 1 wherein said chip is an optical sender or receiver chip, said cable is an optical cable for carrying optical signals, and said adapter holds said optical cable in position for optical communications with said chip.

* * * * *